US008134287B1

(12) United States Patent
Price

(10) Patent No.: US 8,134,287 B1
(45) Date of Patent: Mar. 13, 2012

(54) LOW VOLTAGE CLOSED DRIFT ANODE LAYER ION SOURCE

(75) Inventor: Ray Price, Belleville, MI (US)

(73) Assignee: Mirrage, Ltd., Belleville, MI (US)

( * ) Notice: Subject to any disclaimer, the term of this patent is extended or adjusted under 35 U.S.C. 154(b) by 42 days.

(21) Appl. No.: 12/850,728

(22) Filed: Aug. 5, 2010

Related U.S. Application Data

(60) Provisional application No. 61/231,342, filed on Aug. 5, 2009.

(51) Int. Cl.
*H01J 27/02* (2006.01)

(52) U.S. Cl. ................. 313/361.1; 118/723 FI

(58) Field of Classification Search .... 313/359.1–363.1; 118/723 R, 723 CB, 723 FI
See application file for complete search history.

(56) References Cited

U.S. PATENT DOCUMENTS 6,919,672 B2   7/2005   Madocks

OTHER PUBLICATIONS

Anders, Plasma and Ion Sources in Large Area Coatings: A Review, Conference Paper, Feb. 28, 2005, pp. 1-42, Lawrence Berkeley National Laboratory, University of California, Berkeley, California.

*Primary Examiner* — Nimeshkumar Patel
*Assistant Examiner* — Donald Raleigh
(74) *Attorney, Agent, or Firm* — Young Basile Hanlon & MacFarlane P.C.

(57) ABSTRACT

An ion source includes a pair of pole elements, at least one shunt element, and at least one magnetic field producing element that produces a magnetic field. A gap is defined between the pole elements of the pair of pole elements. The at least one magnetic field producing element and the at least one shunt element cooperate to define at least a part of a magnetic field conducting circuit that conducts the magnetic field between the pole elements of the pair of pole elements. The pair of pole elements and the at least one shunt element are formed from a material that consists essentially of ferrous metal having an overall carbon content of less than 0.08 percent.

10 Claims, 3 Drawing Sheets

LOW VOLTAGE CLOSED DRIFT ANODE LAYER ION SOURCE

CROSS-REFERENCE TO RELATED APPLICATIONS

This application claims the benefit of U.S. Provisional Application Ser. No. 61/231,345, filed Aug. 5, 2009.

FIELD OF THE INVENTION

The invention pertains to the application of coatings to substrates and more particularly, to improvements in methods and apparatus for controlled application utilizing improved ion-assisted deposition techniques.

BACKGROUND

Ion-assisted deposition of coatings on various substrates is well known. An excellent discussion of related processes is found in the article "Plasma and Ion Sources In Large Area Coatings: A Review", published by the Lawrence Berkley National Laboratory, University of California, based on a paper presented at the International Conference on Metallurgical Coatings and Thin Films in 2005, by Dr. Andre Anders.

Particularly challenging problems arise in efforts to conduct ion-assisted deposition on large substrates, such as plate glass. Glass is typically manufactured in 12 foot or wider formats. Since glass is a non-conductive substrate, it does not readily conform itself to the use of conventional bias generators to modify film structure during sputter coating operations.

In the present state of the art, the coating material is typically generated with magnetrons having generally planar configurations or rotating cylinder configurations. However, the arriving plasma stream generated with these types of magnetrons is composed of weakly charged ions and atoms.

Numerous attempts have been made to use current off the shelf closed drift anode layer linear ion technologies to provide a means of ion assist during the production of plate glass, but without success. Current linear design ion sources are designed to run at high voltages, typically 1500-3000 volts in a linear collimated beam format, although the same sources can be run in a "diffuse mode" where the voltage ranges are considerably lower. However, when operating in the diffuse mode, the plasma is very dense and approaches an electrically neutral charge state. This process requires relatively high gas pressures, and the high gas flow is required for diffuse mode operation are typically not compatible with the finely tailored gas flow desired.

In collimated beam format, a preferred format for effective ion assist, as compared to the above-described diffuse mode, there are severe limitations present with current linear ion sources. Specifically, high voltages are required in the collimated beam format, and such high voltages impart substantially higher energies to the departing ions, often destroying the sputtered film at a faster rate than it can condense. These processes utilizing high voltages and high current are well suited for ion etching and pre-treating of substrates in many cases, but are not effective for ion-assisted deposition.

The current ion source technology is also restricted in the optimal pressure range. For example, linear ion sources of the anode layer type such as those provided by the Advanced Energy Corporation, are typically recommended for operation in pressure ranges deeper than 1 mTorr. This pressure range is outside of the preferred sputtering ranges used in the industry. As sputtering pressure becomes deeper and deeper, the deposition rate is severely handicapped, which slows the building rate of the film thickness, and thus leads to increased production times.

It would be desirable to have an ion source that is capable of operating over a broader range of pressures than previously known ion sources, while at the same time operating at voltages that are greatly reduced compared to previously known ion sources.

SUMMARY OF THE INVENTION

An ion source includes a pair of pole elements, at least one shunt element, and at least one magnetic field producing element that produces a magnetic field. A gap is defined between the pole elements of the pair of pole elements. The at least one magnetic field producing element and the at least one shunt element cooperate to define at least a part of a magnetic field conducting circuit that conducts the magnetic field between the pole elements of the pair of pole elements. The pair of pole elements and the at least one shunt element are formed from a material that consists essentially of ferrous metal having an overall carbon content of 0.08 percent or less.

The at least one shunt element, the at least one magnetic field producing element and the pair of pole elements may cooperate to define a channel adjacent to the gap defined between the pair of pole elements. The ion source may include an anode that is disposed within the channel. The ion source may further include a gas supply system for delivering a gas to the channel.

The at least one magnetic field producing element may include at least one permanent magnet. Alternatively, the at least one magnetic field producing element may include at least one rare earth permanent magnet. As another alternative, the at least one magnetic field producing element may include at least one alnico permanent magnet. As a further alternative, the at least one magnetic field producing element may include at least one electromagnetic coil.

The pair of pole elements and the at least one shunt element may consist essentially of ferrous metal having an overall carbon content of less than 0.02 percent. As an alternative, the pair of pole elements and the at least one shunt element consisting essentially of ferrous metal having essentially no carbon.

The present invention provides for a method and apparatus for building anode layer ion sources, including linear ion sources of virtually all required lengths that operate in the preferred collimated beam format, at an expanded operational pressure range, and at voltages which are typically 5 times lower than those required by the current state of the art for use in collimated beam formats. The present invention will also function effectively in the diffuse mode by adjusting the gap width of ion sources with proportionally adjusted results.

The ion sources described in the present invention are capable of operating at pressures as high as approximately 20 mTorr in the narrow collimated beam format, and at pressures at least as low as $1 \times 10^{-5}$ Torr.

DETAILED DESCRIPTION OF THE DRAWINGS

DETAILED DESCRIPTION

Figure 1:
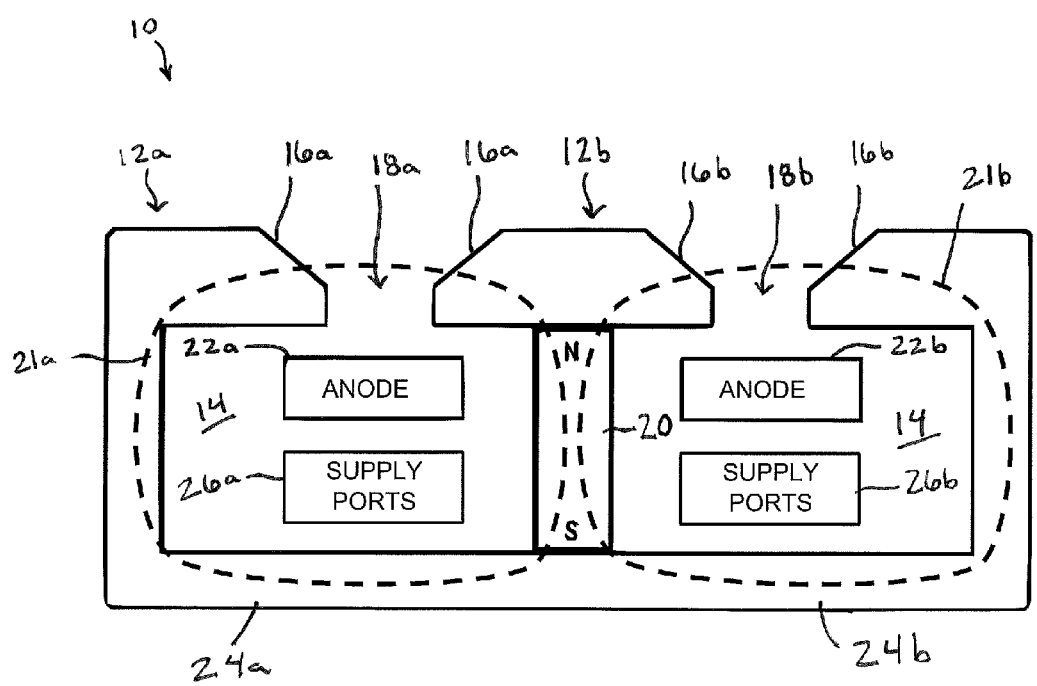
FIG. 1 is a cross-sectional illustration of a prior art linear ion source.

The description herein makes reference to the accompanying drawings wherein like reference numerals refer to like parts throughout the several views, and wherein:

A prior art linear ion source 10 is shown in FIG. 1. The linear ion source 10 is a conventionally constructed anode layer closed drift linear ion source. The linear ion source 10 includes a first housing portion 12a and a second housing portion 12b that define an interior 14 of the linear ion source 10. Each of a first pole element pair 16a and a second pole element pair 16b are defined by the first and second housing portions 12a, 12b, and the pole elements of each pole element pair 16a, 16b are separated from one another by gaps 18a, 18b, which are parallel portions of a single elongate "racetrack" configuration (not shown in FIG. 1) that is defined by the first and second housing portions 12a, 12b. The first and second housing portions 12a, 12b, including the pole element pairs 16a, 16b have traditionally been fabricated from steel-iron alloys or stainless steel.

In order to induce a magnetic field 21a, 21b within the housing portions 12a, 12b, the linear ion source 10 includes at least one magnetic field producing element, such as a permanent magnet 20. The permanent magnet 20 conducts the magnetic field between the pole elements of each of the pole element pair 16a, 16b. In this regard, at least a part of the first housing portion 12a defines a shunt element 24a, 24b that defines at least a part of a magnetic field conducting circuit along which the magnetic field 21a, 21b that is produced by the permanent magnet 20 is conducted. The permanent magnet 20 is typically an Alnico or rare earth magnet. In lieu of the permanent magnet 20, it is also known to induce the magnetic field 21a, 21b within the housing portions 12a, 12b using an electromagnetic coil (not shown).

The linear ion source 10 further includes anodes 22a, 22b that are disposed within the interior 14 of the linear ion source 10, adjacent to the gaps 18a, 18b. Supply ports 26a, 26b are also disposed within the interior 14 of the linear ion source 10 for supplying a gas to the interior 14 of the linear ion source 10.

In the prior art, attempts to increase the efficiency of devices configured similarly to the linear ion source 10 have focused much of their attention on the geometric configurations of the pole element pairs 16a, 16b. Accordingly, many design variations and configurations of the pole element pairs 16a, 16b have been proposed and experimented with. The intent of these efforts has been to manipulate a magnetic field trap that is induced within and above the gaps 18a, 18b that are formed between the pole elements of the pole element pairs 16a, 16b.

In the present invention, it has been determined that an optimal selection of housing material, including that of the pole elements and the shunt elements of the hosing, is critical to the design of a linear ion source, vastly improving operating parameters by affecting the resulting magnetic trap. The housing material is of much greater significance than has been noted in the prior art, and its impact upon the magnetic trap exceeds the improvements that can be made by manipulating the geometric design of the pole elements of the linear ion source.

Figure 2:
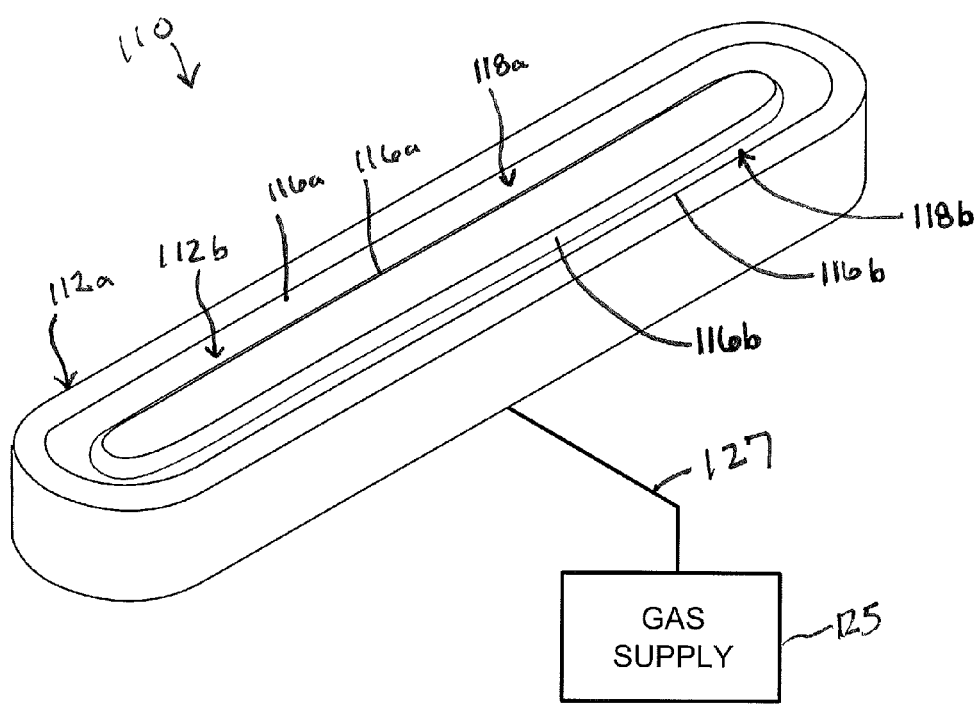
FIG. 2 is a perspective view illustration showing a linear ion source according to the present invention.
Figure 3:
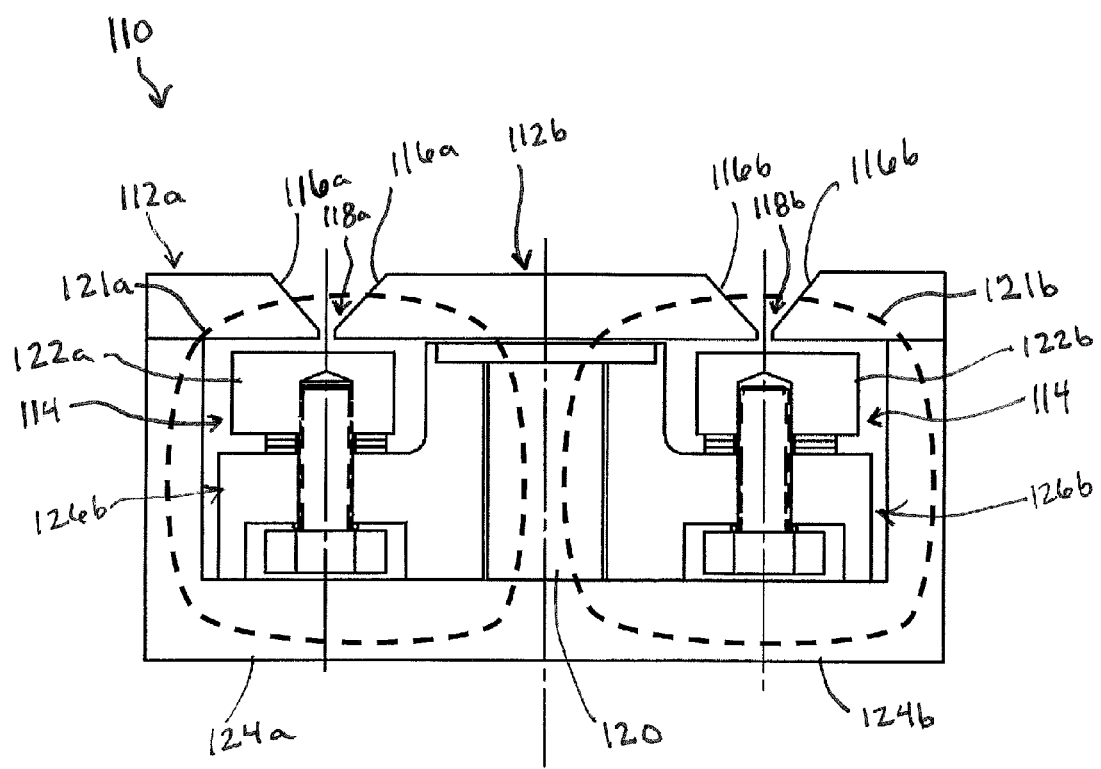
FIG. 3 is a cross-sectional illustration of a linear ion source according to the present invention.

An improved linear ion source 110 according to the present invention is shown in FIGS. 2-3.

The linear ion source 110 includes a first housing portion 112a and a second housing portion 112b that define an interior 114 of the linear ion source 110. Each of a first pole element pair 116a and a second pole element pair 116b are defined by the first and second housing portions 112a, 112b, and the pole elements of each pole element pair 116a, 116b are separated from one another by gaps 118a, 118b, which are parallel portions of a single elongate "racetrack" configuration that is defined by the first and second housing portions 112a, 112b. The first and second housing portions 112a, 112b, including the pole element pairs 116a, 116b are fabricated from material consisting essentially of ferrous metal having a low overall carbon content, such that the overall carbon content of the material is lower than that of prior art ion sources, as will be explained in detail herein.

In order to induce a magnetic field 121a, 121b within the housing portions 112a, 112b, the linear ion source 110 includes at least one magnetic field producing element, such as a permanent magnet 120, such as an Alnico or rare earth magnet. The permanent magnet 120 conducts the magnetic field between the pole elements of each of the pole element pair 116a, 116b. In this regard, at least a part of the first housing portion 112a defines a shunt element 124a, 124b that defines at least a part of a magnetic field conducting circuit along which the magnetic field 121a, 121b that is produced by the permanent magnet 120 is conducted. Alternatively, the magnetic field 121a, 121b could be induced using an electromagnetic coil (not shown).

The linear ion source 110 further includes anodes 122a, 122b that are disposed within the interior 114 of the linear ion source 110, adjacent to the gaps 118a, 118b. A gas supply system for supplying a gas to the interior 114 of the linear ion source 110 includes a gas supply 125 that is connected to supply ports 126a, 126b that are disposed within the interior 114 of the linear ion source 110 via one or more conduits 127.

In the linear ion source 110 of the present invention, optimal results are achieved using a permanent magnet 120 rated at approximately 17,500 Gauss, and when the first and second housing portions are fabricated from a material having a magnetic permeability approaching 17,500 Gauss. However, even if Alnico magnets or an electromagnetic coil is utilized, however, substantial performance gains can still be realized.

In the present invention, the first and second housing portions 112a, 112b are manufactured such that they consist essentially of ferrous metal (e.g. steel) containing a reduced level of carbon as compared to the prior art, and preferably, the first and second housing portions 112a, 112b are manufactured such that they consist essentially of ferrous metal containing essentially no carbon. Carbon inherently "chocks" and is inhibitive to the magnetic permeability. If carbon or carbon clusters are left in the steel matrix, it, over time, converts to carbide which hinders permeability. By selecting this material for all case and pole pieces, namely the first and second housing portions 112a, 112b in the embodiment shown in FIGS. 2-3, maximum magnetic permeability is obtained.

While material having zero carbon would be ideal, essentially no carbon should be understood as describing a carbon content a close to zero as can be practically attained. However, it should be understood that the invention is not limited to devices where the housing contains essentially no carbon. In particular, improvements over the prior art are experienced when the first and second housing portions 112a, 112b are manufactured such that they consist essentially of ferrous metal containing less than 0.08 percent carbon. Moreover, excellent results have been obtained when the first and second housing portions 112a, 112b are manufactured such that they consist essentially of ferrous metal containing less than 0.02 percent carbon. Such steel alloys are typically manufactured by a double vacuum arc furnace process that virtually eliminates all carbon forms in the material matrix.

We have learned, for example, that commonly used steels such as 1010 steel have a nominal carbon content of approximately 0.10 percent carbon content, and do not have carbon contents of less than 0.08 percent. In the present invention, it is desired to achieve carbon content as close to zero as theoretically possible. Although this may not be achievable from a practical standpoint, performance improvements are experienced when the carbon content of the ferrous metal is less than 0.08 percent, and dramatic improvements are realized when the carbon content is 0.02 percent or less.

As an example, when the performance of the present invention (constructed with a housing containing less than 0.02 percent carbon) during deposition of a diamond-like coating (DLC) on a substrate is compared to a prior art closed drift linear plasma source, the following improvements are noted:

TABLE I

|  | Present Invention | Prior Art |
| --- | --- | --- |
| Typical Operating Voltage | 300 V | 500-1500 V |
| Maximum Operating Pressure | 20 mTorr | 3 mTorr |
| Ion Energy | 50-750 eV | 200-750 eV |

As seen in Table I, the linear ion source 110 of the invention may be operated at a lower operating voltage and amperage, and at increased gas supply pressures. This permits a broader range of electron voltages, and gives greater control over the physical properties of the coating that is being formed.

In addition to the advantages noted previously, it is further noted that the linear ion source 110 of the invention is particularly well adapted for use in during densification of films while they are forming. In particular, the linear ion source 110 is able to operate simultaneously, along side a variety of plasma generating sources, such as magnetrons, cathodic arc deposition sources and other physical vapor deposition sources, the arriving atoms (i.e. the condensing film) can be effectively "densified" and thus can be carefully manipulated to generate highly densified, crystalline layers. In the prior art, coatings can, and typically lay down in a spongy, amorphous layer, because of the low energy state of the arriving atoms when the reach the substrate. Prior art linear ion sources could not be used to assist densification in these processes because of design constraints. Also, as a result of the reduction of the operating voltage and amperage of the ion source 110 as compared to the prior art, the linear ion source 110 can be used at room temperature, on temperature sensitive substrates, such as plastics and extremely thin layered coatings that in the past have been difficult to manipulate because they are so thin and delicate.

In addition to being useful for a large area deposition on substrates using the improved linear ion source 110, the present invention has wide-ranging applications. In particular, the same technique could be used for application of materials to solar panels, flat panel television screens and mirrors. Furthermore, deep space ion clusters could utilize the same ion sources, which would require substantially less electrical power to operate. In this regard, it should be understood that the present invention is equally applicable to non-linear ion sources. As an example, the ion source of the present invention can be constructed in a circular configuration, as opposed to using the elongate "race track" configuration of the improved linear ion source 110. In a circular ion source constructed in this manner, the cross sectional configuration shown in FIG. 3 can be maintained, such that the gaps 118a, 118b would be portions of a single circular gap. Other aspects of the circular ion source would be identical to those described with reference to FIGS. 2-3.

While the invention has been described in connection with certain embodiments, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

The invention claimed is:

1. An ion source, comprising:
    a pair of pole elements, wherein a gap is defined between the pole elements of the pair of pole elements;
    at least one shunt element;
    at least one magnetic field producing element that produces a magnetic field, the at least one magnetic field producing element and the at least one shunt element cooperating to define at least a part of a magnetic field conducting circuit that conducts the magnetic field between the pole elements of the pair of pole elements; and
    the pair of pole elements and the at least one shunt element consisting essentially of ferrous metal having an overall carbon content of essentially 0.08 percent or less.

2. The ion source of claim 1, further comprising:
    the at least one shunt element, the at least one magnetic field producing element and the pair of pole elements cooperating to define a channel adjacent to the gap defined between the pair of pole elements.

3. The ion source of claim 2, further comprising:
    an anode disposed within the channel.

4. The ion source of source of claim 3, further comprising:
    a gas supply system for delivering a gas to the channel.

5. The ion source of claim 1, wherein the at least one magnetic field producing element includes at least one permanent magnet.

6. The ion source of claim 1, wherein the at least one magnetic field producing element includes at least one rare earth permanent magnet.

7. The ion source of claim 1, wherein the at least one magnetic field producing element includes at least one alnico permanent magnet.

8. The ion source of claim 1, wherein the at least one magnetic field producing element includes at least one electromagnetic coil.

9. The ion source of claim 1, further comprising:
    the pair of pole elements and the at least one shunt element consisting essentially of ferrous metal having an overall carbon content of 0.02 percent or less.

10. The ion source of claim 1, further comprising:
    the pair of pole elements and the at least one shunt element consisting essentially of ferrous metal having essentially no carbon.

* * * * *